United States Patent [19]

Starr et al.

[11] Patent Number: 5,019,980
[45] Date of Patent: May 28, 1991

[54] GENERAL PURPOSE AVIONICS DISPLAY MONITOR

[75] Inventors: Benjamin F. Starr, Lynnwood, Wash.; Mark L. Wallace, Aurora, Colo.; Gaylen M. Talley; Paul M. Woo, both of Seattle, Wash.

[73] Assignee: The Boeing Company, Seattle, Wash.

[21] Appl. No.: 380,130

[22] Filed: Jul. 14, 1989

[51] Int. Cl.⁵ .................. G06F 15/20; G06F 11/00
[52] U.S. Cl. ..................... 364/424.04; 364/424.06; 364/200; 340/945
[58] Field of Search .............. 364/424.01, 424.03, 364/424.04, 424.06, 550, 551.01, 900, 200; 340/945

[56] References Cited

U.S. PATENT DOCUMENTS

| | | | |
|---|---|---|---|
| 3,603,948 | 9/1971 | Medlinski | 340/214 |
| 3,928,830 | 12/1975 | Bellamy et al. | 235/153 AK |
| 4,249,186 | 2/1981 | Edwards | 346/35 |
| 4,267,569 | 5/1981 | Baumann et al. | 364/424.04 |
| 4,483,002 | 11/1984 | Groom, Jr. et al. | 371/29 |
| 4,497,057 | 1/1985 | Kato et al. | 371/29 |
| 4,621,335 | 11/1986 | Bluish et al. | 364/550 |
| 4,626,996 | 12/1986 | Arlott | 364/424 |
| 4,648,068 | 3/1987 | Ninnemann et al. | 364/900 |
| 4,651,298 | 3/1987 | Currier, Jr. | 364/900 |
| 4,672,611 | 6/1987 | Fukuhara et al. | 371/59 |
| 4,675,675 | 6/1987 | Corwin et al. | 340/945 |
| 4,787,053 | 11/1988 | Moore | 364/551.01 |
| 4,845,495 | 7/1989 | Bollard et al. | 364/424.06 |
| 4,943,919 | 7/1990 | Aslin et al. | 364/424.01 |

OTHER PUBLICATIONS

Tavora et al.; the RLV-AN Advanced Remote Terminal for Avionic Systems; May 1980; 1271–1277.

*Primary Examiner*—Parshotam S. Lall
*Assistant Examiner*—Michael Zanelli

*Attorney, Agent, or Firm*—Christensen, O'Connor, Johnson & Kindness

[57] ABSTRACT

A display monitor for monitoring data flowing on the avionics data buses of an aircraft includes an interface card (53) for interfacing a PC (51) to avionics buses (31, 33, 35, 37, 39) and a set of discrete input/output lines (63). The interface card (53) includes a series of ARINC receiver/transmitters (65, 67, 69, 71), a programmed CPU (55), a primary memory (59) and a dual port I/O memory (61). The ARINC receiver/transmitters provide communication paths to the avionics data buses and the dual port I/O memory (61) provides a communication path to the PC data bus (75). The interface card CPU (55) continuously scans the ARINC receiver/transmitters looking for avionics data and, at greater intervals, the discrete input lines (63) and the dual port I/O memory (61) looking for commands. ARINC data is initially "dumped" into the card primary memory (59) and later transferred to the dual port shared memory (61) from whence it is transferred to a work buffer in the PC. As it occurs, new data is written over old data. The high/low state of the discrete lines are used to control the setting of flags in the dual port shared memory (61). The PC (51) continuously scans the dual port shared memory (61) and the PC keyboard (52). In response to either discrete flags or PC keyboard commands, the PC shifts data in the work buffer to more permanent storage and/or prints selected data stored in the work buffer. The PC keyboard is also used to create commands that switch the monitor from a strictly monitoring mode of operation to an autotest/monitoring mode of operation. When in the autotest/monitoring mode of operation, key push buses are decoupled from avionics equipment and the PC is used to create commands similar to those produced by the decoupled key push sources. The data resulting from the commands is handled in the same way similar data is handled in the strictly monitoring mode of operation.

19 Claims, 11 Drawing Sheets

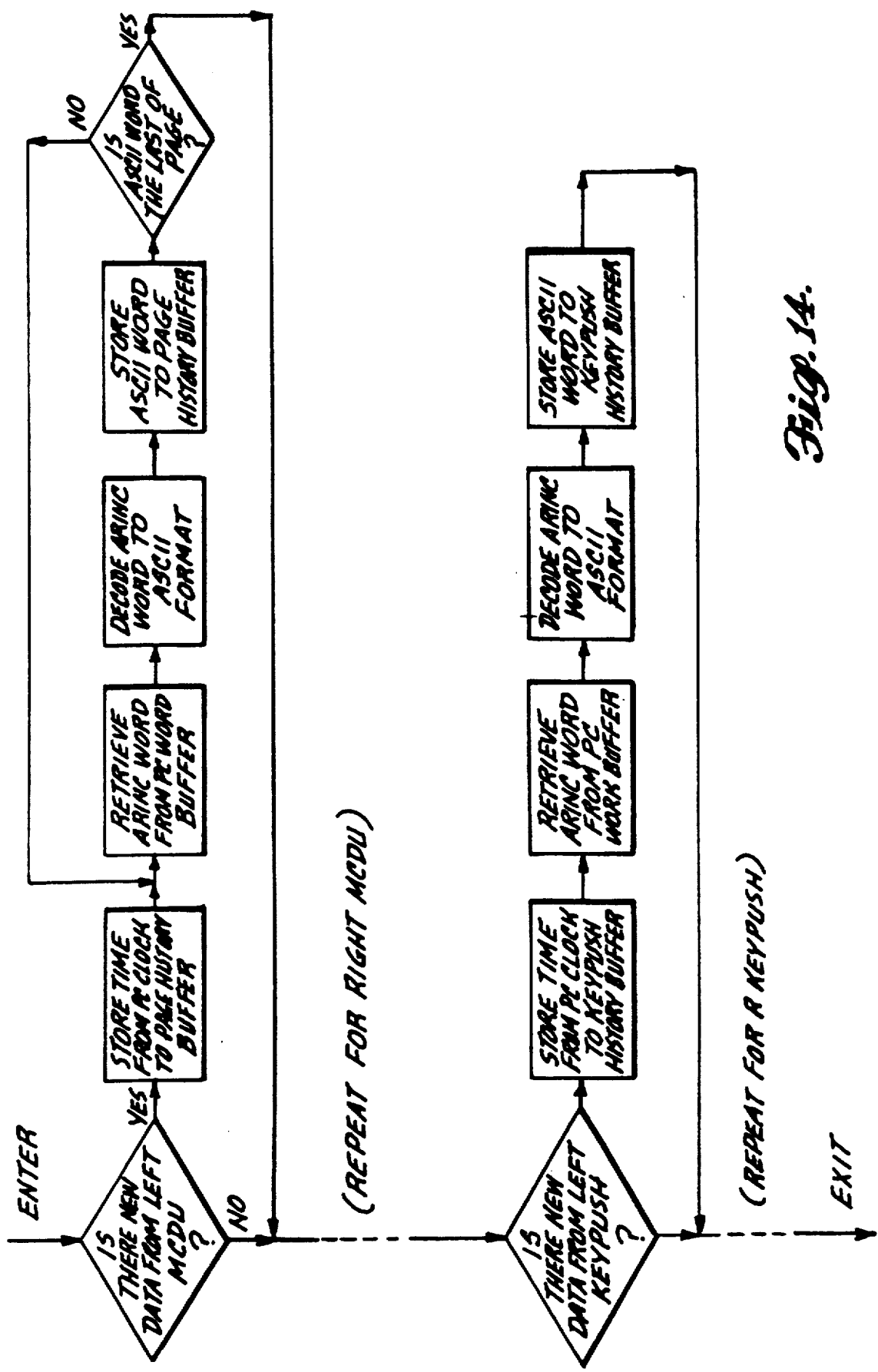

GENERAL PURPOSE AVIONICS DISPLAY MONITOR

TECHNICAL AREA

This invention relates to monitors and, more particularly, monitors for monitoring the avionic systems of aircraft.

BACKGROUND OF THE INVENTION

Many times during the laboratory and flight testing of flight management systems (e.g., autopilot, autothrottle and flight management computer systems) momentary monitor display anomalies appear. Unfortunately, the engineers and pilots who observe such anomalies often cannot satisfactorily describe them in a manner that enables their resolution. Further, the normal recording instrumentation creates a huge mass of data that must be shifted through and organized in order to diagnose aircraft avionics problems, including monitor display anomalies, after they occur.

Pilots of aircraft in service have the same problem. That is, they occasionally observe momentary monitor display anomalies, i.e., they observe anomalies in display monitors associated with flight management systems. Often the reports of such FMS display monitor anomalies lack clarity and, thus, cannot be properly diagnosed. As a result, engineering time is wasted trying to solve monitor anomaly problems, regardless of whether they originate in a laboratory environment, a flight test environment or an inservice environment.

Modern "glass" flight decks, which rely on a few page display monitors to display a variety of information, have greatly enhanced the problems associated with momentary monitor display anomalies. The diagnosis difficulty is further enhanced by the fact that modern aircraft produce more data than present day flight recorders are capable of storing for an extended period of time. As a result, a substantial amount of desirable data is either not recorded or rapidly lost. For example, control display unit (CDU) key pushes are important when analyzing a monitor display anomaly because erroneous pushes can create the source of the anomaly. A time history of key pushes is also a desirable piece of information to have available when diagnosing momentary monitor display anomalies. A record of the time history of page displays is also desirable, as is navigational and other information, depending upon the nature of the avionic system or systems being monitored.

While various types of avionic monitors have been developed, none has satisfactorily addressed the problems associated with momentary monitor display anomalies. A CDU monitor built for use with the 737-300 aircraft produced by the Boeing Company uses reformatted lateral guidance and buffer dumps in the same program to provide diagnostic information regarding the state of internal variables as well as navigational display anomalies. Unfortunately, this monitor fails to provide diagnostics with respect to the general state of the variables of an integrated flight management system. This monitor also fails to provide diagnostics in an expeditious manner since it requires that data be processed prior to being analyzed.

The present invention is directed to a general purpose avionics display monitor that overcomes the disadvantages of prior monitoring systems. More specifically, the present invention is directed to a general purpose avionics display monitor that is ideally suited for viewing, recording and storing information about flight management system anomalies, particularly momentary monitor display anomalies so that such anomalies can be readily evaluated when they occur or at a later date. The invention is particularly usable with modern "glass" flight decks that include one or more multipurpose control display units (MCDUs).

SUMMARY OF THE INVENTION

In accordance with this invention, a monitor for monitoring data flowing on the avionics data buses of an aircraft is provided. The monitor includes a data processing system, such as a programmed personal computer (PC), and an interface for interfacing the data processing system to the avionics buses and to a set of discrete input and output lines. Preferably the interface is in the form of an interface card suitable for mounting in a PC expansion slot. The interface includes a series of ARINC receiver/transmitters, a programmed central processing unit (CPU), a program memory and a dual port shared memory. The ARINC transmitter/receivers provide communication paths to the avionics data buses, and the dual port shared memory provides a communication path to and from the data bus of the data processing system. The interface card CPU continuously scans the ARINC receiver/transmitters looking for avionics data. At less frequent intervals the interface card CPU checks the discrete lines and one "side" of the dual port shared memory looking for commands. ARINC data is initially "dumped" into the primary memory and later transferred to the dual port shared memory. New data is written over old data in both memories. The high/low state of the discrete lines is used to control the setting of flags in the dual port shared memory. The data processing system continuously scans the dual port shared memory for new ARINC data. When new data is located it is transferred to a work buffer for temporary storage. At less frequent intervals the data processing system checks the state of the dual port shared memory flags controlled by the high/low state of the discrete lines and a keyboard for commands. Commands for the ARINC receiver/transmitters or for the discrete output lines are transferred to the dual port shared memory, for transfer to the appropriate device by the interface card CPU. In response to either discrete flags, keyboard commands, or MCDU key pushes, the avionics monitor creates "snapshots" of ARINC data stored in the work buffer by transferring the ARINC data temporarily stored in the work buffer to a permanent storage location and/or a printer to create a hard copy.

In accordance with further aspects of this invention, the avionics buses being monitored include those that connect one or more multipurpose control display units (MCDUs) to the flight management computer (FMC) of an aircraft, including the buses that carry the key pushes produced by the MCDUs as well as the page display data sent to the MCDUs by the FMC.

In accordance with other aspects of this invention, the data processing system keyboard is also used to create commands that switch the general purpose avionics display monitor from a strictly monitoring mode of operation to an autotest/monitoring mode of operation. In the autotest/monitoring mode of operation, the key push buses running to the FMC are decoupled from the normal key push source, i.e., the MCDUs, and the data processing system creates commands similar to those produced by the decoupled MCDUs. The data resulting from the commands is handled the same way similar data is handled when the general purpose avionics display monitor is in its strictly monitoring mode of operation. When in the autotest/monitoring mode of operation, preferably, a host computer supplies signals to the FMC similar to those created by aircraft sensors.

In accordance with still further aspects of this invention, selected work buffer data is also transferred to a history buffer that stores time histories of selected avionics receiver/transmitter information by adding new information to the input "end" of the history buffer while simultaneously deleting the oldest information in the buffer. In response to either discrete flags or keyboard commands, the time histories stored in the buffers are printed out on a hard copy printer.

In accordance with still other aspects of this invention, the general purpose avionics display monitor also monitors the data buses that connect the FMC to the electronic flight information system (EFIS) integrated display unit (IDU) that displays navigational information.

As will be readily appreciated from the foregoing description, the invention provides a general purpose avionics display monitor that is ideally suited for monitoring the data flowing on the avionics buses of an aircraft. The invention is particularly suitable for monitoring the key pushes created by MCDUs and sent to an FMC and the page control data supplied to the MCDUs by the FMC. Thus, the invention is ideally suited for monitoring anomalies, particularly momentary monitor display anomalies created by data flowing on the MCDU/FMC data buses. The invention is also ideally suited for monitoring the data flowing from an FMC to an EFIS IDU, i.e., an IDU designed to display navigational information. The invention can also be used to transfer data to ACARS (ARINC Communications and Reporting System) and thus downlinked in flight, as well as provide CMC (Central Maintenance Computer) data dump capability. The invention can be expanded to serve as an ACM (Airborne Condition Monitoring) System, having access to information not normally monitored by present ACM Systems.

BRIEF DESCRIPTION OF THE DRAWINGS

The foregoing objects and many of the attendant advantages of this invention will become more readily appreciated as the same becomes better understood by reference to the following detailed description when taken in conjunction with the accompanying drawings wherein:

FIG. 14 is a flow diagram of a decode data and store in histories if kept routine suitable for use in the check shared memory subroutine illustrated in FIG. 10.

DESCRIPTION OF THE PREFERRED EMBODIMENT

The present invention is directed to a general purpose avionics display monitor, i.e., a system for monitoring the flow of data on the avionics buses of an aircraft. In addition to a monitoring mode of operation, the general purpose avionics display monitor includes an autotest-/monitoring mode of operation. When placed in the autotest/monitoring mode of operation, commands suitable for controlling selected avionics equipment, namely a flight management computer (FMC), similar to the commands produced by avionics control equipment, namely a multipurpose control display unit (MCDU), are created.

As will be better understood from the following description, the presently preferred embodiment of the invention was designed for use with avionics systems that include an FMC controlled by one or more MCDUs. In addition to controlling MCDU displays in response to data produced by aircraft sensors and key pushes generated by the MCDUs, the FMC interacts with an electronic flight information system (EFIS) integrated display unit (IDU). The primary IDU displays are a navigational display (ND), a primary flight display (PFD), an engine indication crew alerting display (EICAD), and an EFIS display.

Figure 1:
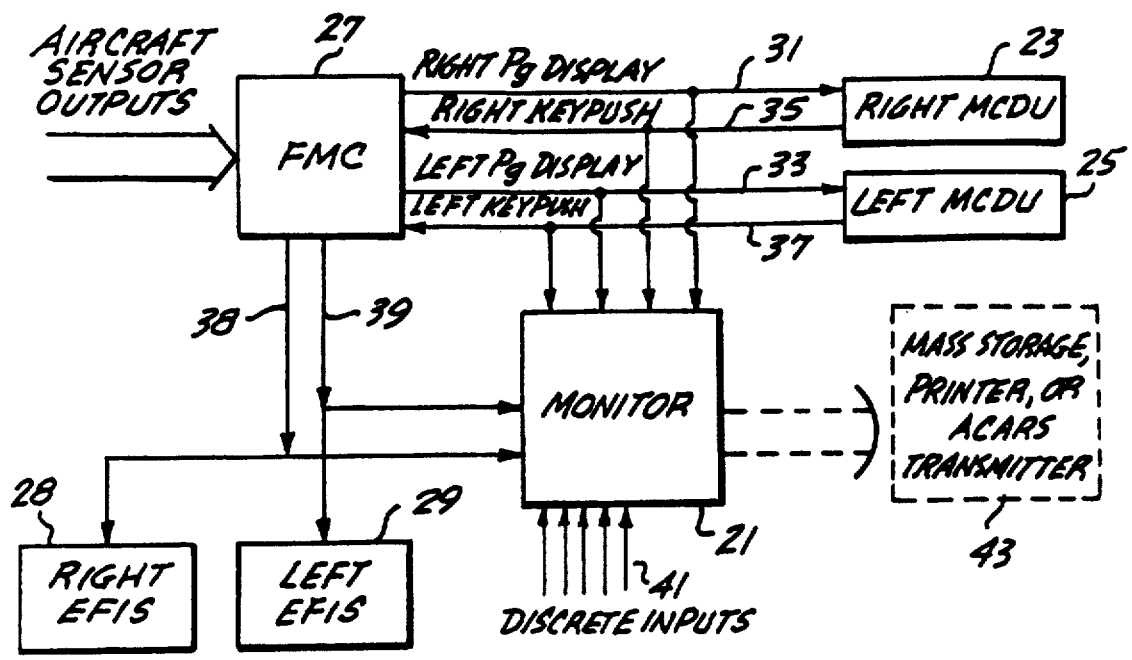
FIG. 1 is a block diagram illustrating a general purpose avionics display monitor formed in accordance with the invention coupled to the avionics data buses connecting an FMC to right and left MCDUs and an EFIS IDU.
Figure 2:
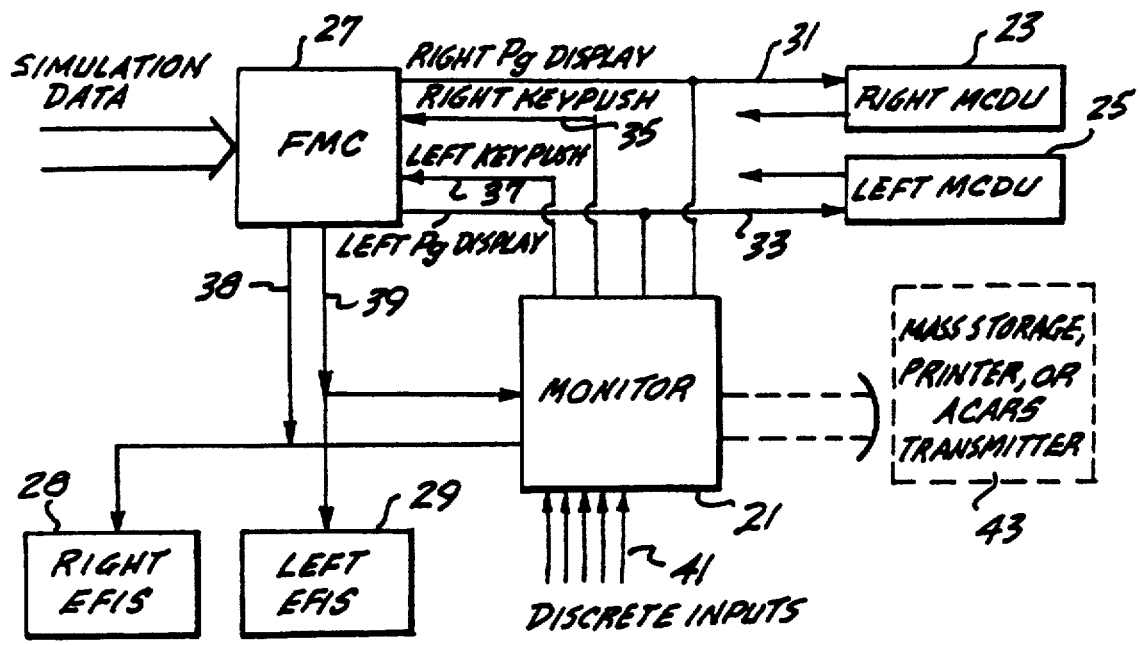
FIG. 2 is a block diagram illustrating a general purpose avionics display monitor formed in accordance with the invention connected to the same data buses illustrated in FIG. 1 so as to perform autotest functions as well as strictly monitoring functions.

FIGS. 1 and 2 illustrate a general purpose avionics display monitor 21 formed in accordance with the invention connected to the buses running from right and left MCDUs 23 and 25 to an FMC 27 and to the buses running to right and left EFISs 28 and 29. FIG. 1 depicts the connections when the general purpose avionics display monitor 21 is in a strictly monitoring mode of operation and FIG. 2 illustrates the connections when the general purpose avionics display monitor 21 is in an autotest/monitoring mode of operation. In the monitoring mode of operation (FIG. 1) the general purpose avionics display monitor 21 has no ability to interfare with the operation of the FMC. Contrariwise, in the autotest/monitoring mode of operation (FIG. 2) the general purpose avionics display monitor 21 is the source of key push commands normally produced by the right and left MCDUs 23 and 25. More specifically, the general purpose avionics display monitor 21 is connected to the right and left page display buses 31 and 33 that transmit right and left MCDUs page display data from the FMC 27 to the right and left MCDUs 23 and 25. The general purpose avionics display monitor 21 is also connected to the right and left key push buses that transmit right and left MUDC key push data from the right and left MCDUs 23 and 25 to the FMC. When the general purpose avionics display monitor is in the autotest/monitoring mode of operation, as illustrated in FIG. 2, the right and left key push buses 35 and 37, on the MCDU side of the general purpose avionics display monitor connection, are broken.

The general purpose avionics display monitor 21 is also connected to the buses 38 and 39 that connect the FMC to the right and left EFISs 28 and 29. Further, the general purpose avionics display monitor 21 is connected to one or more discrete input lines 41 and to a suitable hard or soft storage media or a transmitter for transmitting information to a remote source designated by a single block 43 entitled mass storage, printer or ACARS transmitter. (An ACARS transmitter is part of an ACARS link used to transmit data from an aircraft to an ACARS receiver or some other suitable reception and storage media, such as a cellular phone system, a satellite transponder, etc.) Alternatively, the remote source could be a CMC (Central Maintenance Computer) or an EIU (Electronic Interface Unit). In addition, rather than just transmitting data from the monitor to a remote source as shown in FIG. 1, data and/or instructions could be transmitted from the remote source to the monitor.

Figure 3:
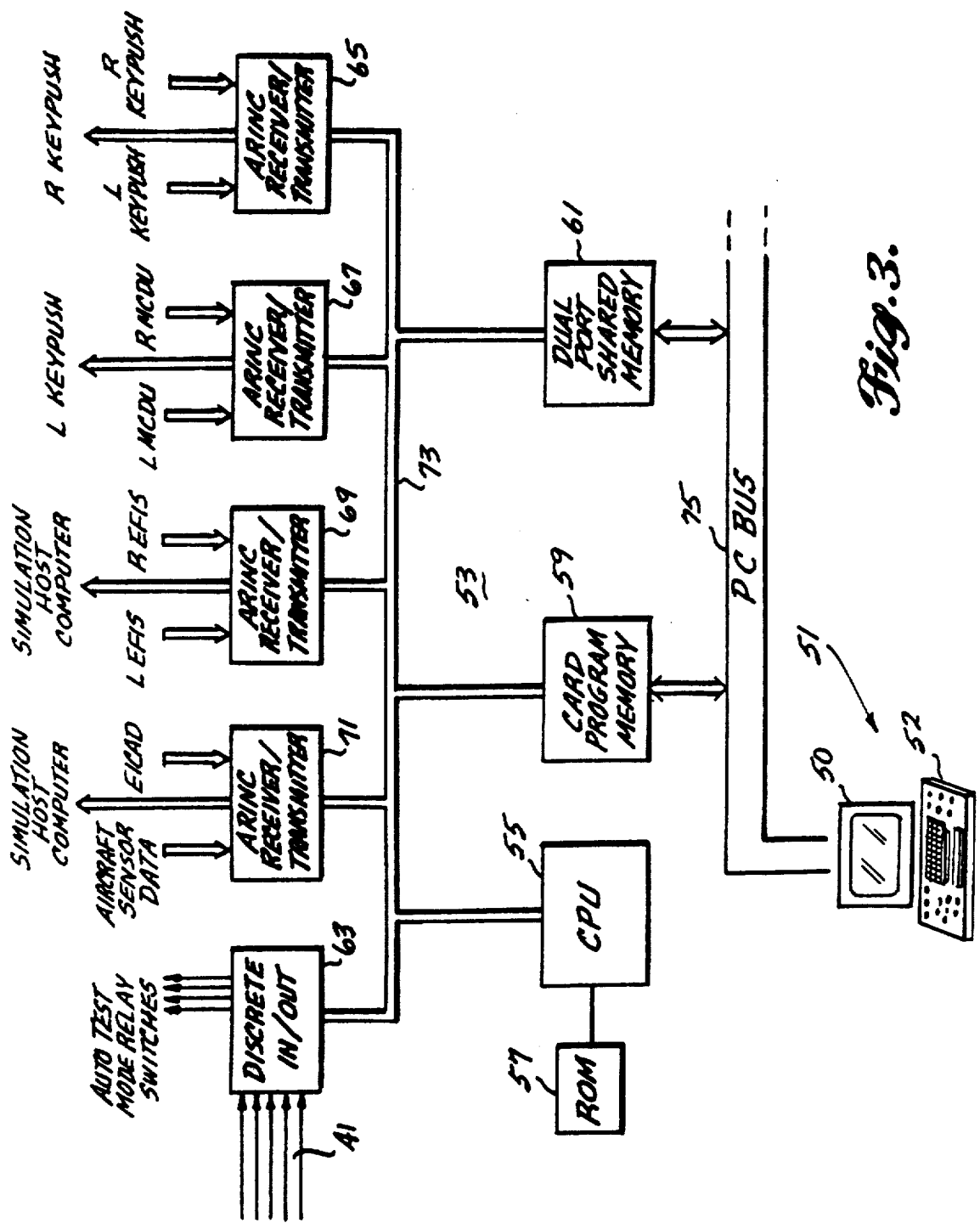
FIG. 3 is a block diagram of a general purpose avionics display monitor formed in accordance with the invention.

As shown in FIG. 3, the presently preferred embodiment of the invention includes a personal computer (PC) 51 having an interface card 53 mounted in one of the PC's expansion slots. The PC 51 includes standard items such as disk drives, a hard disk (which may form the mass storage 43), a printer, a CPU, RAM and ROM memory, a keyboard and a monitor, etc., none of which are illustrated separately, except for the monitor 50 and the keyboard 52, since all of these components are well known. The interface card 53 includes: a CPU 55; a fixed memory (e.g., a ROM) 57; a transistory program memory (e.g., RAM) 59; a dual port shared memory 61; a plurality of discrete input and outputs lines designated for purposes of description as a discrete in/out block 63; and a plurality of (e.g., four) ARINC receiver/transmitters 65, 67, 69 and 71. Preferably, all of the interface card components illustrated in FIG. 3 (and other necessary but incidental components not illustrated) are in the form of large scale integrated circuit chips mounted on a printed circuit board. Since CPUs, ROM and RAM memories and dual port shared memories are well-known standard computer chips, they are not described here. (Dual port shared memories are memories that are accessible from two ports, either of which can be used to write data and instructions into the memory or read data and instructions from the memory.)

The ARINC receiver/transmitters are preferably ARINC receiver/transmitter integrated circuit chips. Available ARINC receiver transmitter chips have two receive channels and a single transmit channel. Thus, the four ARINC receiver/transmitters 65, 67, 69 and 71, illustrated in FIG. 3, provide eight receive channels and four transmit channel capability. Two of the transmit channels are used to transmit right and left key push instructions to the right and left key push data buses 35 and 37 when the general purpose avionics display monitor is in its autotest/monitoring mode of operation. The other two transmit channels are used to send instruction to a simulation host computer that produces signals that simulate those produced by aircraft sensors when the general purpose avionics display monitor is in its autotest/monitoring mode of operation. The illustrated receive channels include right and left key push channels, right and left MCDU channels, right and left navigational display (ND) channels, an EICAD channel and aircraft sensor data channel. The aircraft sensor data channel is active when the general purpose avionics display monitor is in its autotest/monitoring mode of operation, as well as when it is in the monitoring only mode of operation. As noted above, when in the autotest/monitoring mode of operation, data that simulates the outputs of aircraft sensors, rather than aircraft sensor data, is normally applied to the FMC. The aircraft sensor data channel may carry the simulation data as well as aircraft sensor data that is not simulated. The high/low state of the discrete output lines control the open/closed state of relay switches that control the connection of the right and left key push buses 35 and 37 to the right and left MCDUs 23 and 25. The function of the discrete input lines is described below.

As will be better understood from the following description, the program that controls the operation of the CPU 55 controls the flow of data and commands on a bus 73 that interconnects the various components of the interface card illustrated in FIG. 3 and described above. The other port of the dual port shared memory 61 is connected to the internal bus 75 of the PC 51. As a result, the dual port shared memory 61 provides a communication path between the PC 51 and the interface card 53.

FIGS. 4-14 are simplified flow diagrams that depict the way the CPU 55 and the PC are programmed to control the flow of data and commands along the card bus 73 and the PC bus 75, respectively. The program flow diagrams are simplified in the sense that many obvious operations well understood by computer programmers are not depicted. The program flow diagrams have been simplified to emphasize the features of the program that form a portion of the invention and so as to not obfuscate these features in a mass of irrelevant detail.

Figure 4:
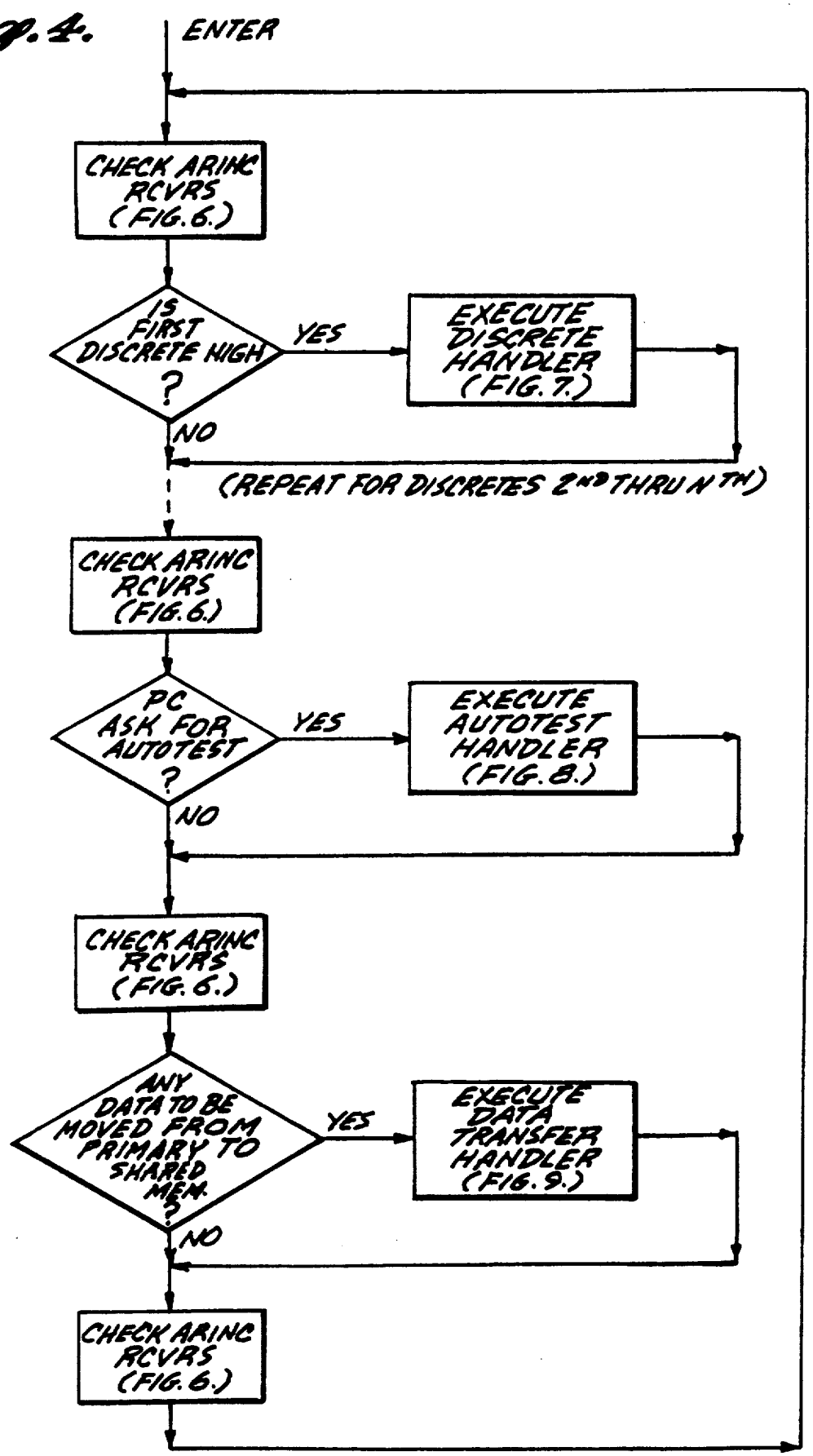
FIG. 4 is a flow diagram illustrating a program formed in accordance with the invention for controlling the data and command transfer functions of the interface card portion of the general purpose avionics display monitor illustrated in FIG. 3.

FIG. 4 is a flow diagram illustrating the way the CPU 55 is programmed to control the flow of data between the various interface card components connected to the card bus 73. The first step in the illustrated program flow diagram is to check the output of each of the ARINC receiver/transmitters 65, 67, 69 and 71 to determine if any new data is available. If new ARINC data is available on one or more of the outputs, the new ARINC data is handled in the manner illustrated in FIG. 6 and described below. Basically, this involves transferring the new data from the ARINC receiver/transmitter possessing new data to the card primary memory 59. Next the first discrete input is tested to determine if it is high or low. If the first discrete input is high, a DISCRETE HANDLER subroutine, illustrated in FIG. 7 and described below, is executed. In essence, this involves setting a related flag in the dual port shared memory 61. After the DISCRETE HANDLER subroutine has been executed or if the first discrete input is low, the remaining discrete inputs, denoted the 2nd-nth discretes in FIG. 4, are tested to determine if they are high or low. After all the discrete inputs have been tested, and DISCRETE HANDLER subroutines executed, if necessary, the ARINC receivers are again checked to determine if new data is available by making a pass through the CHECK ARINC RECEIVERS subroutine, illustrated in FIG. 6 and described below.

Next a test is made to determine if an autotest command has been received from the PC. This is accomplished by testing the state of an autotest flag in the dual port shared memory 61 that is set in the manner described above. If a PC autotest command has occurred, the AUTOTEST HANDLER subroutine illustrated in FIG. 8 and described below is executed. After the AUTOTEST HANDLER subroutine has been executed, or if no autotest command from the PC has occurred, the ARINC receivers are again checked for new data by making a pass through the CHECK ARINC RECEIVERS subroutine illustrated in FIG. 6 and described below. Thereafter, a test is made of the card primary memory 59 to determine if the card program memory is storing data that is to be moved to the dual port shared memory. If data to be moved is present in the program memory 59, a DATA TRANSFER HANDLER subroutine (FIG. 9) is executed. Thereafter, or if no data to be moved is present in the primary memory, the ARINC receivers are again checked by making a pass through the CHECK ARINC RECEIVERS subroutine (FIG. 6), following which the program is repeated.

In summary, the program illustrated in FIG. 4 transfers data from the ARINC receiver/transmitters first to the card program memory and then to the dual port shared memory. The reason for this indirect, rather than direct, transfer to a dual port shared memory 61 is due to the fact that dual port shared memories have relatively slow access times when compared to other volatile RAM base memories. In order to avoid the loss of data that slow access time might cause, in accordance with the invention, data is first rapidly transferred from the ARINC receiver/transmitter outputs to the card program memory 59. Thereafter, when more time is available, data is transferred from the card primary memory 59 to the dual port shared memory 61. The CPU program (FIG. 4) also tests the discrete inputs and sets flags in the dual port shared memory 61 for each discrete input that is high. As will be better understood from the following discussion, discrete inputs provide a second source of commands similar to some of the commands created by actuating PC keyboard function keys (or combinations of keys). In this regard, the presently preferred embodiment of the invention is designed to be a piece of test equipment that is temporarily connected to the data buses of an aircraft rather than being permanently connected. In use, the inputs of the ARINC receiver/transmitters of the interface card 53 are connected to the required buses in the electronics bay of an aircraft to be tested. The technician using the PC is positioned so that he/she can view the PC monitor 50, which displays information identical to that being displayed on both of the MCDUs 23 and 25 of the aircraft. Simultaneously another observer, either one of the pilots, or a flight test engineer, located in the cockpit of the aircraft, observes the actual MCDU displays. The high/low state of the discrete inputs 41 are controlled by the open/closed state of switches operated by the pilot or the flight test engineer. When one of the switches is actuated, a related discrete line goes high. As will be better understood from the previous description, the high causes a flag in the shared memory 61 to be set. The set flag is read by the PC program, which then takes whatever action the flag dictates, such as creating a hard copy print or transferring to a more permanent memory location data temporarily stored in a work buffer. Thus, the discrete inputs allow a flight deck observer, such as a pilot or flight test engineer, to cause selected data to be either printed out and/or transferred to a more permanent storage location by simply actuating one or more switches depending upon the nature of the anomaly. A similar result can be achieved by the pilot pushing a selected MCDU key or combination of keys.

Finally, the interface card program illustrated in FIG. 4 provides a means for transferring PC commands from the dual port shared memory 61 to either one or more of the discrete outputs, or to the ARINC receiver/transmitters. As noted above, such actions are only allowed to occur when the autotest/monitoring mode of operation has been enabled.

Figure 5:
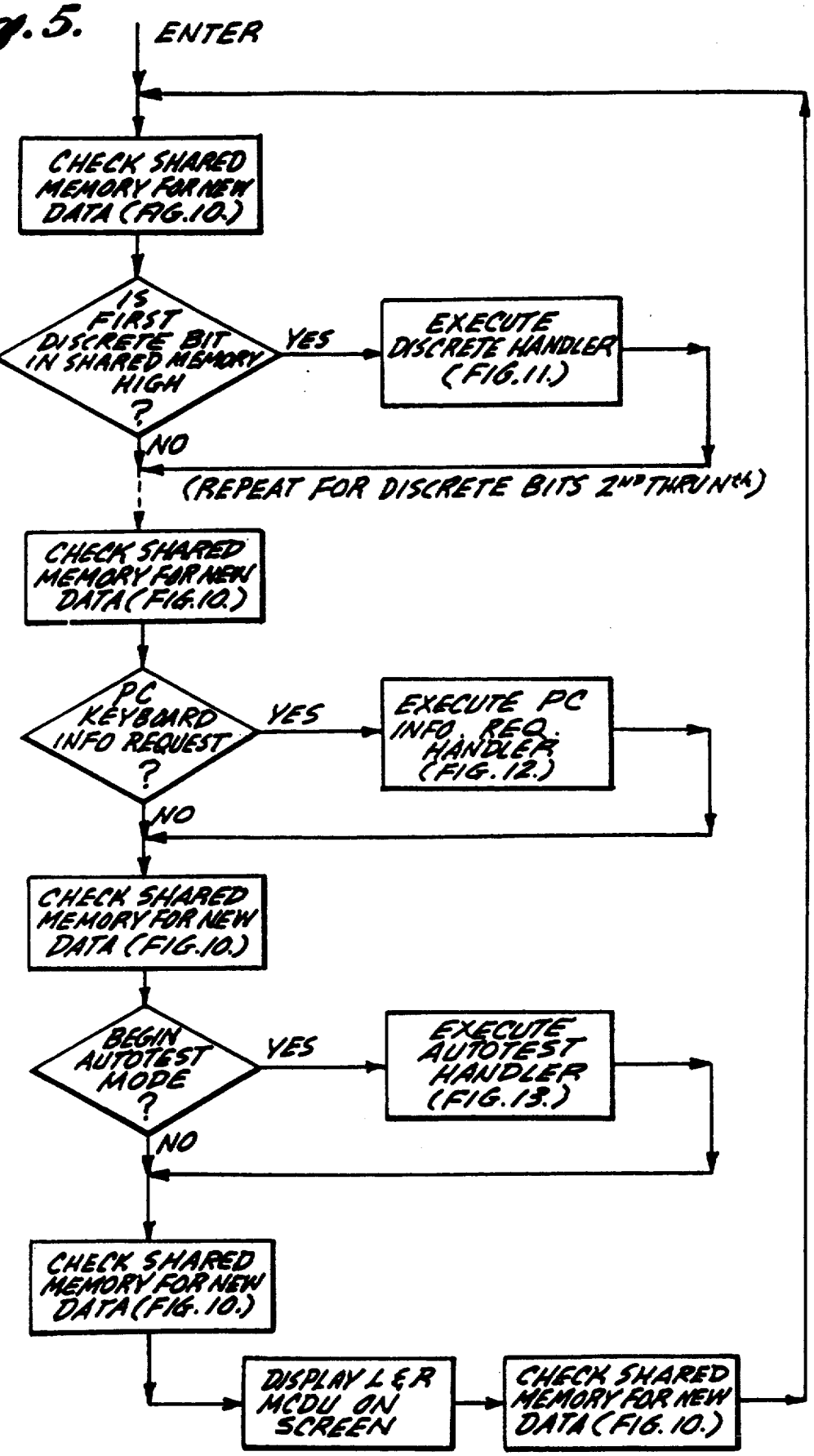
FIG. 5 is a flow diagram illustrating a program formed in accordance with the invention for controlling the data and command transfer functions of the PC portion of the general purpose avionics display monitor illustrated in FIG. 3.
Figure 6:
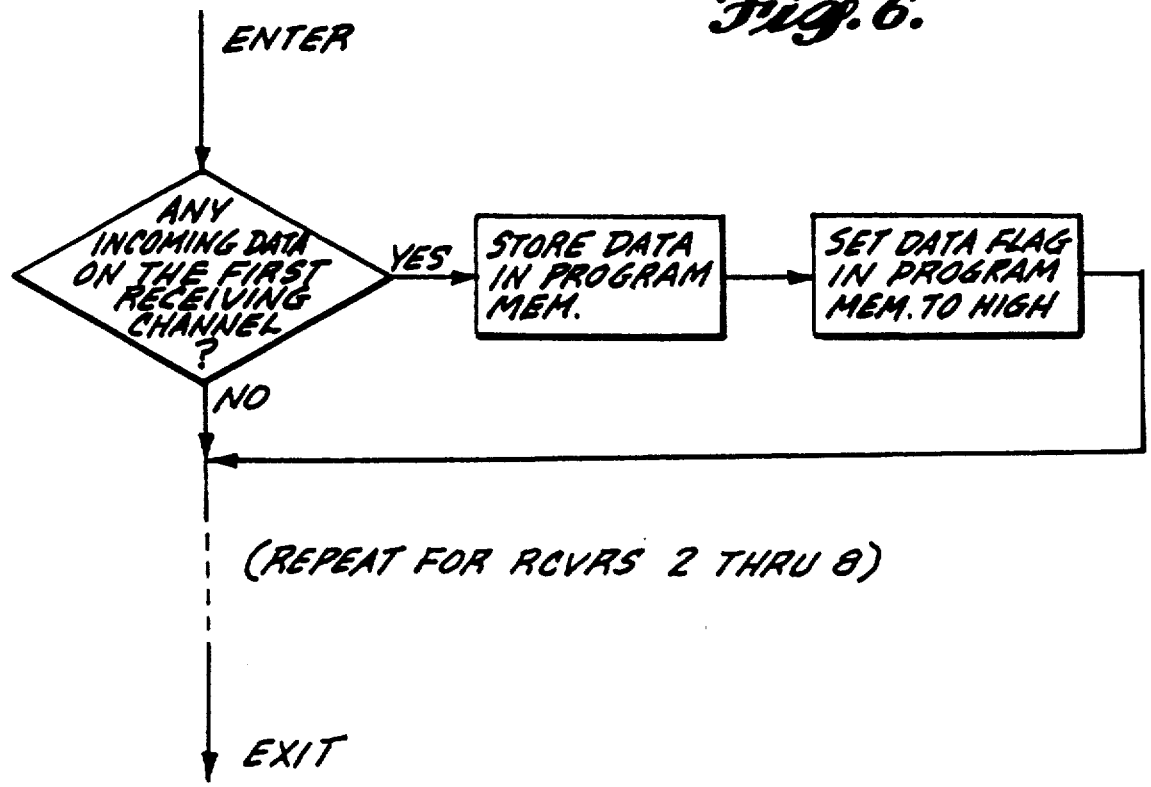
FIG. 6 is a flow diagram of a CHECK ARINC RECEIVERS subroutine suitable for use in the program illustrated in FIG. 4.

FIG. 5 is a flow diagram illustrating the main steps of the data transfer portion of the PC program. The first step in the illustrated portion of the PC program is a test that checks the shared memory 61 to see if it has received new data. This test is accomplished by making a pass through the CHECK SHARED MEMORY FOR NEW DATA subroutine illustrated in FIG. 10 and described below. In general, if new data is present in the shared memory 61, it is transferred to a PC work buffer. After the CHECK SHARED MEMORY FOR NEW DATA subroutine is finished, a test is made to determine if the first discrete bit in the shared memory is high. If the first discrete bit is high, a DISCRETE HANDLER subroutine illustrated in FIG. 11 and described below is executed. Basically this subroutine retrieves data from the PC work buffer and causes the data to be printed in hard copy form as well as stored in a more permanent memory location. After these actions are accomplished, the discrete bit is reset. After the DISCRETE HANDLER subroutine has been executed, or if the first discrete bit is low, the remaining discrete bits, designated the 2nd-nth discrete bits, are tested and the DISCRETE HANDLER subroutine executed as required. As will be recalled, the state of the discrete bits is determined by the high/low state of the discrete inputs.

Next, the shared memory is again tested to determine if any new data is available for transfer to the PC work buffer by making a pass through the CHECK SHARED MEMORY FOR NEW DATA subroutine illustrated in FIG. 10 described below. Then, a test of the PC keyboard 52 is made to determine if the user has made an information request by depressing a function key or set of keys. If an information request has been made, a PC INFORMATION REQUEST HANDLER subroutine, illustrated in FIG. 12 and described below, is executed. After the PC INFORMATION REQUEST HANDLER subroutine has been executed or if no information request has been made, the shared memory is again checked to determine if new data is available for transfer to the work buffer by making a pass through the CHECK SHARED MEMORY FOR NEW DATA subroutine illustrated in FIG. 10. Next a test is made to determine if a begin autotest mode of operation request has been made by the user actuating a keyboard function key or set of keys. If the user has requested that autotest mode of operation begin, the AUTOTEST HANDLER subroutine illustrated in FIG. 13 and described below is executed. If a begin autotest mode of operation request has not been or after the autotest handling subroutine has been executed, the shared memory is again checked for new data by making a pass through the CHECK SHARED MEMORY FOR NEW DATA subroutine illustrated in FIG. 10. Thereafter, the current left and right MCDU page data stored in the work buffer is displayed (or refreshed) on the monitor 50 of the PC 51. Thereafter, the shared memory 61 is again checked for new data by making a pass through the CHECK SHARED MEMORY FOR NEW DATA subroutine illustrated in FIG. 10. Thereafter, the program recycles to the beginning.

Figure 11:
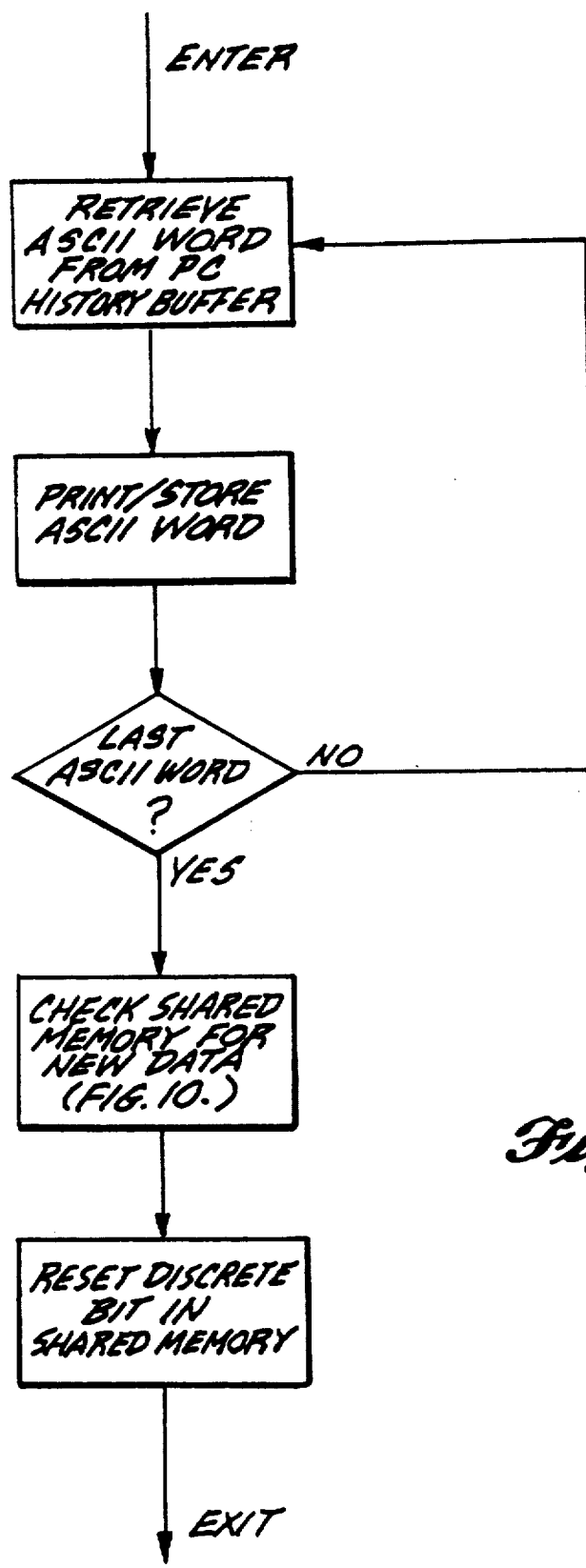
FIG. 11 is a flow diagram of a DISCRETE HANDLER subroutine suitable for use in the program illustrated in FIG. 5.

As will be appreciated from the foregoing description of FIG. 5, in essence, the data and instruction handling portion of the PC program continuously checks the output of the shared memory for new data and transfers that data to the work buffer of the PC. Less frequently, the discrete flags of the shared memory 61, set by the card program based on the high/low state of the discrete inputs 41, are tested and, if high, a subroutine that transfers data from the work buffer of the CPU to a printer and a more permanent storage location is executed. Also at less frequent intervals, the PC keyboard is checked for information requests, i.e., user commands. As will be better understood from the following description, in essence, the PC INFORMATION REQUEST HANDLER subroutine (FIG. 12) that responds to keyboard information requests in many respects is similar to the DISCRETE HANDLER subroutine (FIG. 11). Also, the data transfer portion of the PC program tests the keyboard to determine if the user has commanded the general purpose avionics display monitor to begin an autotest mode of operation. If so, an AUTOTEST HANDLER subroutine is executed. Finally, the PC monitor display is updated or refreshed.

As noted above, FIG. 6 is a subroutine that has passed through each time the ARINC receivers are checked (FIG. 4). The first step in the check ARINC receiver subroutine is to determine if any incoming data is on the output of the ARINC receiver connected to the first receiver channel—the right key push channel of the first ARINC receiver/transmitter 65 illustrated in FIG. 3. If data is being received, the data is stored to the card program memory 59. Thereafter, a related data present flag in the card program memory is set high. This data flag is later detected by the CPU when a test is made to determine if any data is available to be moved from the primary memory to the shared memory. If no incoming data is present on the first receiver channel or after the data has been stored in the card program memory and the data flag has been set, the foregoing loop is repeated for the remaining receiver channels. That is, each receiver channel is tested to determine if ARINC data is present. If ARINC data is present, the data is stored in the card primary memory 59 and a related data present flag set.

Figure 7:
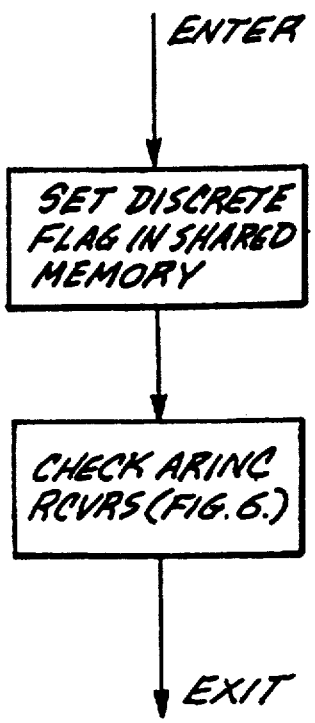
FIG. 7 is a flow diagram of a DISCRETE HANDLER subroutine suitable for use in the program illustrated in FIG. 4.

FIG. 7 is a flow diagram of a DISCRETE HANDLER subroutine suitable for use in the card program illustrated in FIG. 4 and described above, which is executed when a discrete input is high. The first step of the data handler subroutine is to set a related discrete flag in the shared memory 61. Thereafter a pass is made through the CHECK ARINC RECEIVERS subroutine illustrated in FIG. 6 and described above. Then the program exits the DISCRETE HANDLER subroutine.

Figure 8:
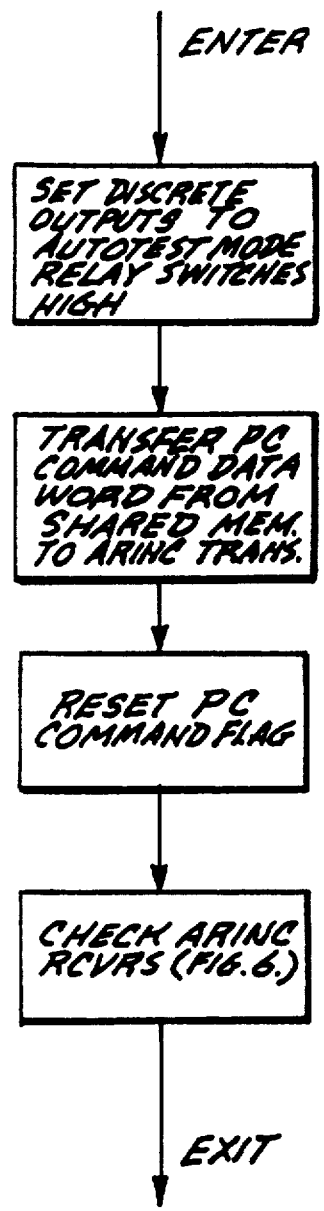
FIG. 8 is a flow diagram of an AUTOTEST HANDLER subroutine suitable for use in the program illustrated in FIG. 4.

FIG. 8 is a flow diagram of an AUTOTEST HANDLER subroutine suitable for use in the card program illustrated in FIG. 4 and described above. The first step in the AUTOTEST HANDLER subroutine is to set the discrete outputs to the autotest mode relay switches to high. As shown in FIG. 2 and described above, this results in the right and left MCDUs 23 and 25 being disconnected from the right and left key push data buses 35 and 37. Then the PC command data word is transferred from the shared memory to the related ARINC transmitter. In the case of the embodiment of the invention illustrated in FIG. 5, this is either the first ARINC receiver/transmitter 65 or the second ARINC receiver/transmitter 67. After the PC command data word has been transferred from the shared memory 61 to the appropriate ARINC transmitter, the PC command flag, which denoted the presence of a PC command data word, is set low. Thereafter, the ARINC receivers' outputs are checked for new data by making a pass through the check ARINC receiver subroutine illustrated in FIG. 6 and described above.

Figure 9:
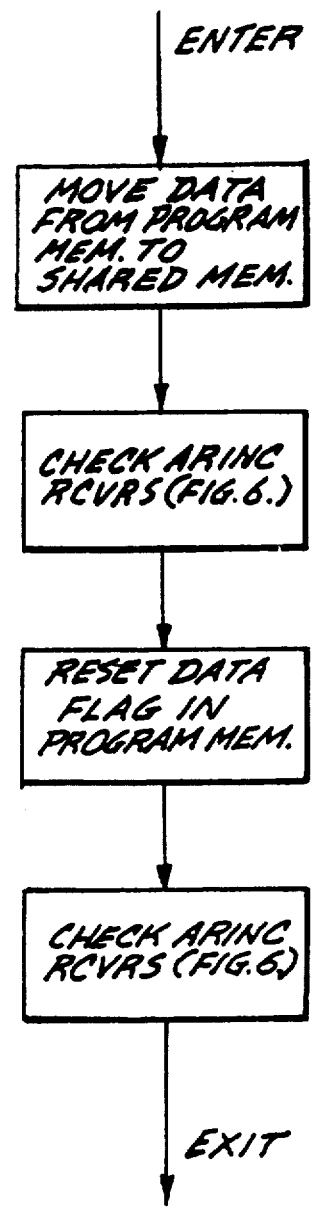
FIG. 9 is a flow diagram of a DATA TRANSFER HANDLER subroutine suitable for use in the program illustrated in FIG. 4.

FIG. 9 is a flow diagram of a DATA TRANSFER HANDLER subroutine suitable for use in the card program illustrated in FIG. 4 and described above. The first step of the DATA TRANSFER HANDLER subroutine illustrated in FIG. 9 is to move data from the card primary memory to the shared memory. Next the ARINC receivers are checked to see if they are receiving new data by making a pass through the check ARINC receiver subroutine illustrated in FIG. 6 and described above. Then, the card program memory data flag, which was set when the data that was moved to the shared memory was stored in the card program memory, is reset. Thereafter the ARINC receivers are again checked for new data by making another pass through the checked ARINC receiver subroutine illustrated in FIG. 6 and described above.

Figure 10:
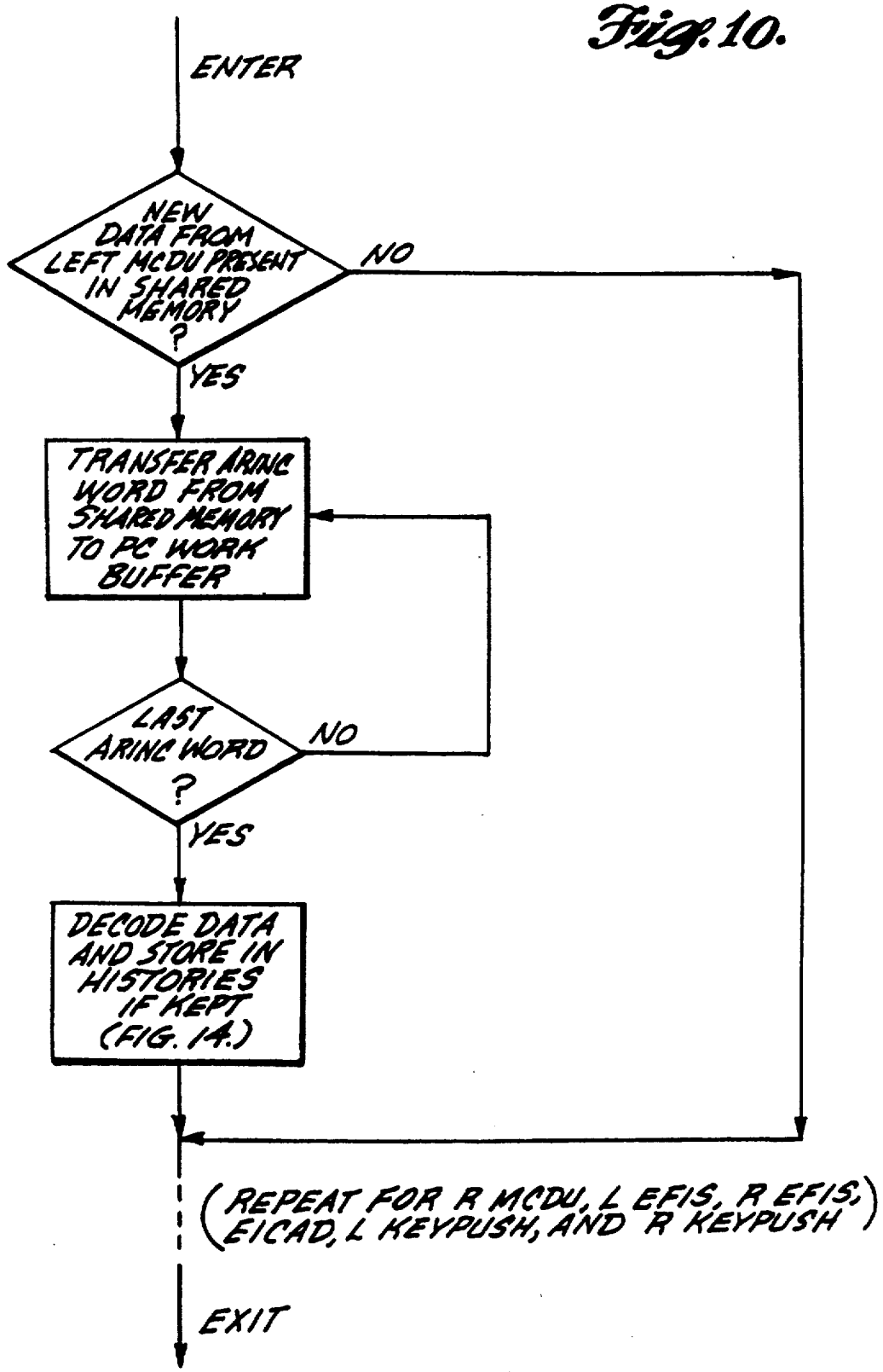
FIG. 10 is a flow diagram of a check shared memory subroutine suitable for use in the program illustrated in FIG. 5.

FIG. 10 is a flow diagram of a CHECK SHARED MEMORY FOR NEW DATA subroutine suitable for use in the PC program illustrated in FIG. 5 and described above. The first step of the CHECK SHARED MEMORY FOR NEW DATA subroutine illustrated in FIG. 10 is a test to determine if any new page data from the left MCDU is present in the shared memory. This test can be accomplished in various ways. One way is to set a flag when new left MCDU page data is transferred from the card primary memory 59 to the dual port shared memory 61 and performing the test by checking the state of the flag. Another way of performing the test is to compare the left MCDU page data in the dual port shared memory 61 with the left MCDU page data in the PC work buffer. If new left MCDU data is present in the shared memory, the first ARINC word is transferred from the shared memory to the PC work buffer. Then a test is made of the transferred ARINC word to determine if it is the last ARINC word in the shared memory. If it is not the last ARINC word, the loop is repeated. After the last word has been transferred, the data is decoded and stored in a history if a history is kept for the particular data, in this case the left MCDU page data, by making a pass through the DECODE DATA AND STORE IN HISTORY IF KEPT routine illustrated in FIG. 14 and described below. After the data has been decoded and stored in a history if kept, or if no new left MCDU page data is present in the shared memory, the foregoing sequence of steps is repeated for the right MCDU, the left EFIS, the right EFIS, the EICAD, the left key push and the right key push data. That is, the shared memory is tested to determine if new data from any of these sources is present. If present, the ARINC data words are transferred to the PC work buffer, and decoded and stored in a history buffer, if kept for that particular data source. Preferably history buffers are only kept for left and right MCDU data and for left and right key push data. Thereafter the check program exits the stored memory for new data subroutine. Preferably, the work buffer is formed such that new data is written over old data. Thus, at any point in time the work buffer only stores current data.

FIG. 11 is a flow diagram of a DISCRETE HANDLER subroutine suitable for use in the PC program illustrated in FIG. 5 and described above. The first step in the DISCRETE HANDLER subroutine illustrated in FIG. 11 is to retrieve the first ASCII word from the part of the PC history buffer associated with the discrete bit (flag) that caused a pass through the DISCRETE HANDLER subroutine—the left MCDU, for example. Thereafter, the ASCII word is both printed and stored, i.e., transferred to a more permanent memory location. While both operations are preferred, only one can be performed, if desired. Either the ASCII word can be printed or the ASCII word can be transferred to a more permanent storage location. In any event, after the ASCII word has been printed and/or stored, a test is made to determine if the ASCII word is the last ASCII word in the part of the PC history buffer associated with the discrete bit that caused the pass through the DISCRETE HANDLER subroutine. If it is not the last ASCII word, the next ASCII word is retrieved from the PC history buffer and the loop repeated. After the last ASCII word has been retrieved and printed and/or stored, the shared memory is checked for new data by making a pass through the CHECK SHARED MEMORY FOR NEW DATA subroutine illustrated in FIG. 10 and described above. Thereafter, the discrete bit in the shared memory that created the pass through the DISCRETE HANDLER subroutine is reset. Then the program exits the DISCRETE HANDLER subroutine.

Figure 12:
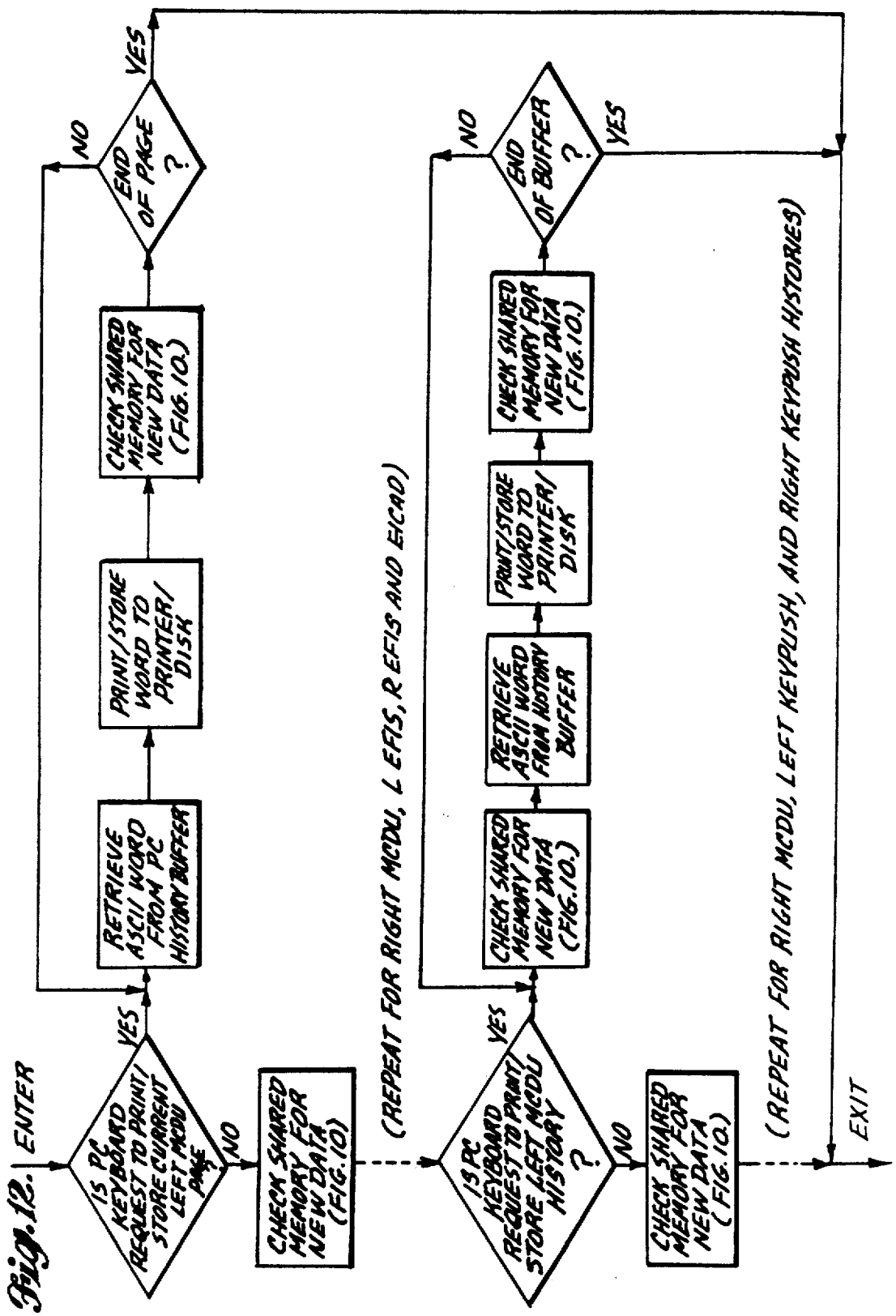
FIG. 12 is a flow diagram of a PC INFORMATION REQUEST HANDLER subroutine suitable for use in the program illustrated in FIG. 5.

FIG. 12 is a flow diagram of a PC information handler subroutine suitable for use in the PC program illustrated in FIG. 5 and described above. The first step in the PC INFORMATION REQUEST HANDLER subroutine is a test to determine if the PC keyboard request is a request to print and store the current left MCDU page data. (Alternative to a request to print and store, the request could be for either function, i.e., print or store.) If the PC keyboard is a request to print and store the current left MCDU page data, the first ASCII word is retrieved from the part of the PC history buffer that stores the left MCDU page data and the word is printed and stored by being sent to a printer and a disk. Next a check of the stored memory is made to determine if new data is present by making a pass through the check stored data subroutine illustrated in FIG. 10 and described above. Thereafter, a test is made to determine if the end of the part of the PC history buffer that stores the current left MCDU page data has been reached. If the word is not the last word in the related part of the PC history buffer, the loop is repeated, i.e., the next ASCII word from the PC history buffer is retrieved and printed and stored. This loop is repeated until the last word in the part of the PC history buffer that stores the current left MCDU page data has been printed and transferred to a more permanent storage location, i.e., a disk. When this occurs, the program exits the PC INFORMATION REQUEST HANDLER subroutine illustrated in FIG. 12.

If the PC keyboard request is not a request to print and store the current left MCDU page data, the shared memory is checked for new data by making a pass through the check shared memory subroutine illustrated in FIG. 10 and described above. Thereafter, the foregoing sequence of steps is repeated for right MCDU, left EFIS, right EFIS and EICAD data, i.e., the PC keyboard request is analyzed to determine if it relates to right MCDU page data, left EFIS data, right EFIS data or EICAD data. If the PC keyboard refers to any of these sources of data, the ASCII words related to the data source are retrieved one-by-one from the PC history buffer and printed and stored. When the end of the related part of the history buffer is reached, the program exits the PC INFORMATION REQUEST HANDLER subroutine.

If the PC keyboard request is not a request to print/store current MCDU, EFIS, and EICAD data, a test is made to determine if the PC keyboard request is a request to print and store the data in the left MCDU history buffer. If the request is a request to print and store left MCDU history, a check of the shared memory is made to determine if new data is present by making a pass through the check stored memory for new data subroutine illustrated in FIG. 10 and described above. Thereafter, the first ASCII word in the left MCDU history buffer is retrieved, and printed and stored. (Alternatively the left MCDU history buffer data could be printed or stored.) Storage occurs by transferring the ASCII word to a disk or other more permanent storage medium. Thereafter, another test is made to determine if new data is present in the shared memory by making a pass through the CHECK SHARED MEMORY FOR NEW DATA subroutine illustrated in FIG. 10 and described above. Next, a test is made to determine if all of the data in the left MCDU history buffer has been printed and/or stored. If the end of the left MCDU history buffer has not been reached, another pass is made through the foregoing sequence of steps. This loop is repeated until the end of the left MCDU history buffer is reached. When this occurs, the program exits the PC INFORMATION REQUEST HANDLER subroutine.

If the PC keyboard request is not a request to print and store left MCDU history, a pass is made through the CHECK SHARED MEMORY FOR NEW DATA subroutine illustrated in FIG. 10 and described above. Thereafter, the PC keyboard request is tested in sequence to determine if the request is a request to print and store right MCDU, left key push or right key push history data. If so, the sequence of retrieval, printing and storing steps illustrated in FIG. 12 and described above for the left MCDU history occurs. Following each keyboard request test is a check to determine if new data is present in the shared memory by making a pass through the CHECK SHARED MEMORY FOR NEW DATA subroutine illustrated in FIG. 10 and described above.

Figure 13:
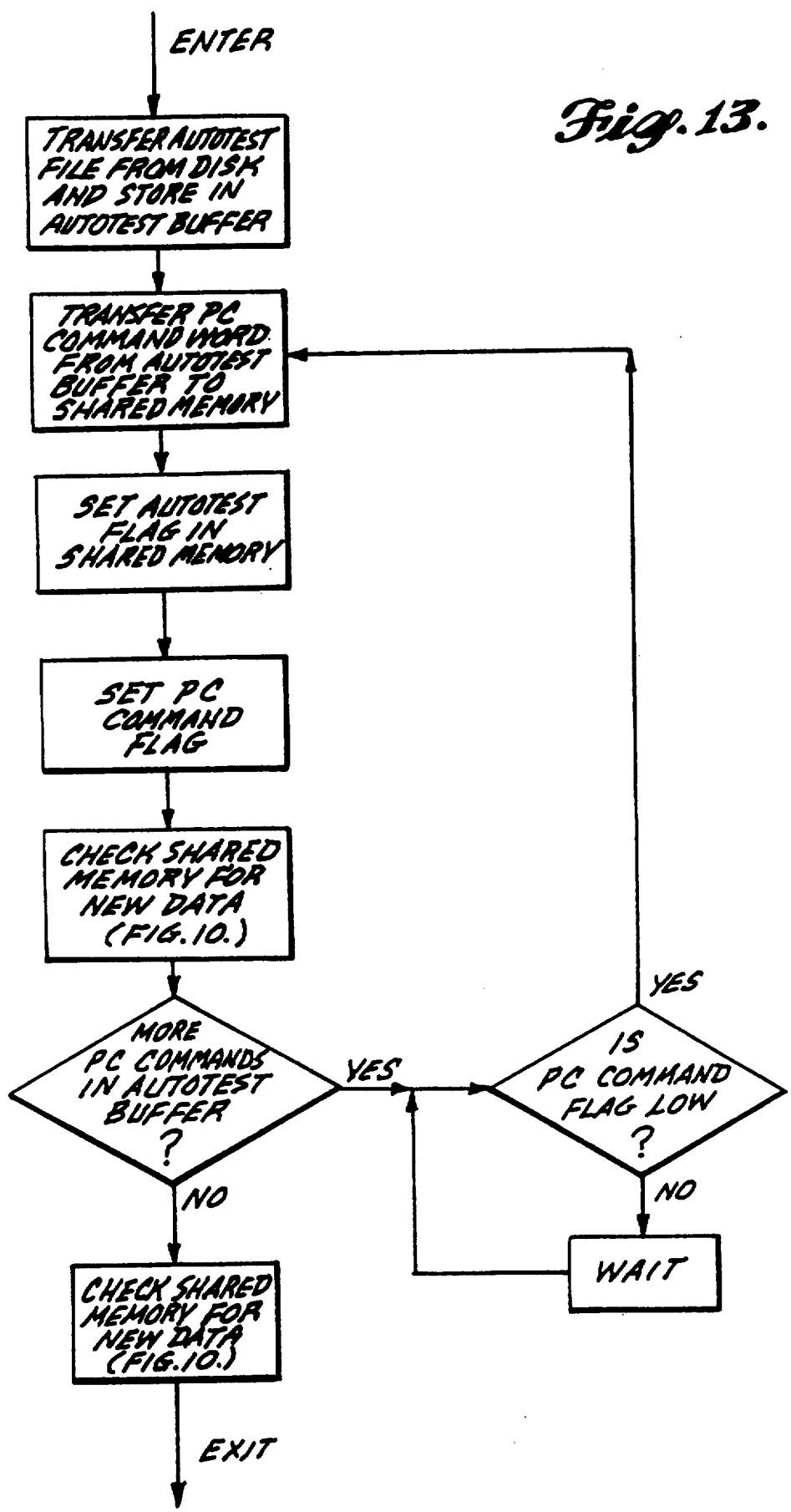
FIG. 13 is a flow diagram of an AUTOTEST HANDLER subroutine suitable for use in the program illustrated in FIG. 5.

FIG. 13 is a flow diagram of an AUTOTEST HANDLER subroutine suitable for use in the PC program illustrated in FIG. 5 and described above. The first step in the AUTOTEST HANDLER subroutine illustrated in FIG. 3 is the transfer of an autotest file from a permanent storage location, e.g., a disk to an autotest buffer. Thereafter, the first PC command word in the autotest buffer is transferred to the shared memory. Next the autotest flag in the shared memory is set. Then the PC command flag in the shared buffer is set. Thereafter, the program checks to determine if new data is present in the shared memory by making a pass through the CHECK SHARED MEMORY FOR NEW DATA subroutine illustrated in FIG. 10 and described above. Following this check, a test is made to determine if any more PC commands are in the autotest buffer. If other PC commands are present in the autotest buffer, a test is made to determine if the PC command flag has been reset. If the PC command flag is not reset, because the PC command data has not yet been transferred from the shared memory to the appropriate ARINC receiver/transmitter in the manner described above, the program enters a wait loop. When the PC command flag is reset, the program transfers the next PC command word from the autotest buffer to the shared memory. This loop is repeated until all the PC command words in the autotest buffer have been transferred to the shared memory. Thereafter, a check of the shared memory for new data is made by making a pass of the CHECK SHARED MEMORY FOR NEW DATA subroutine illustrated in FIG. 10 and described above. Then, the program exits the AUTOTEST HANDLER subroutine illustrated in FIG. 13.

FIG. 14 illustrates a DECODE DATA AND STORE IN HISTORY IF KEPT routine suitable for use in the CHECK SHARED MEMORY FOR NEW DATA subroutine illustrated in FIG. 10 and described above. The first step of the DECODE DATA AND STORE IN HISTORY IF KEPT routine illustrated in FIG. 14 is a test to determine if there is new page data from the left MCDU present in the left MCDU page data section of the PC work buffer. If new page data from the left MCDU is present in the work buffer, the time from a clock that forms part of the PC is stored in a page history buffer. Thereafter the first ARINC word of the new left MCDU page data is retrieved from the PC work buffer. The ARINC word is decoded, (i.e., converted) from ARINC format to ASCII format. Thereafter, the ASCII format word is stored in the page history buffer in association with the PC clock time. Then a test is made to determine if the ASCII word is the last word of the left MCDU page data. If the ASCII word is not the last word of the left MCDU page data, the next left MCDU page data ARINC word is retrieved from the PC work buffer and the foregoing steps repeated. This loop is repeated until the MCDU page data word in ARINC format is converted to ASCII format and stored in the left MCDU page history buffer. Then the main loop is repeated for the right MCDU page data. After the right MCDU page data stored in the PC work buffer is transferred to the right MCDU page history buffer, or if no new right MCDU page data is present in the PC work buffer, a test is made to determine if new left keypad data is present in the PC work buffer. If new left keypad data is present, PC clock time is stored in a left key push history buffer. Thereafter, the new left key push data word in ARINC form is retrieved from the PC work buffer. The retrieved ARINC word is decoded (i.e., converted) from ARINC format to ASCII format and the ASCII format word is stored in the left key push history buffer in association with the PC clock time. Thereafter, the foregoing sequence of steps is repeated for right key push data, i.e., a test is made to determine if new right key push data is present in the PC work buffer. If new data is present, it is converted to ASCII format and stored in a right key push history buffer.

As will be appreciated by those skilled in this art and others from the foregoing description, the invention provides a general purpose avionics display monitor that copies data flowing on the avionics buses of an aircraft to the memory of a PC for either more permanent storage or for printout, as required. The use of two independent data transfer loops efficiently and rapidly transfers data. The invention allows data associated with display anomalies to be readily stored for easy retrieval and analysis at a later date. Rather than storing huge amounts of data that must be processed prior to analysis, the invention provides a system that only stores relevant data, i.e., the data of interest to the evaluation of an anomaly recognized by an observer. This is accomplished by requiring the observer to take a positive action, such as a depression of a discrete key and/or creation of a keyboard command. Data not related to an anomaly is written over as new data occurs. Hence, only relevant data must be processed which avoids the need to preprocess data in order to find relevant data prior to analysis.

While a preferred embodiment of the invention has been illustrated and described, it will be appreciated that various changes can be made therein without departing from the spirit and scope of the invention. For example, rather than being stored in a mass storage media, such as a hard disk or an optical disk located on board an aircraft, page, key push and history data can be transmitted via an ACARS (or other telemetry) link to a ground station for storage and/or printout. Further, the functions performed by the switches connected to the discrete inputs could be performed by MCDU switches. Or the state of the discrete inputs could be controlled by MCDU switches as well as by separate discrete input switches. Consequently, within the scope of the appended claims, it is to be understood that the invention can be practiced otherwise than as specifically described herein.

The embodiments of the invention in which an exclusive property or privilege is claimed are defined as follows:

1. A general purpose avionics display monitor comprising:
   (a) an interface means for interfacing a data processing system to a plurality of aircraft data buses for conveying data from the aircraft data buses to the data processing system, said interface means including:
      (i) a dual port shared memory;
      (ii) a program memory;
      (iii) a plurality of data receivers suitable for connection to aircraft data buses for receiving data flowing on said aircraft data buses;
      (iv) a transfer data bus coupled to one port of said dual port shared memory, and said plurality of data receivers for transferring data therebetween; and
      (v) a CPU coupled to said transfer data bus, said CPU programmed to control the flow of data on said transfer data bus such that data received by said plurality of data receivers is first transferred to said program memory in a rapid manner and later transferred in a slower manner to said dual port shared memory; and (b) a data processing system coupled to the other port of said dual port shared memory for receiving data stored in said dual port shared memory and for displaying and storing said data, said data processing system including:

(i) a user interface mechanism for receiving user commands;

(ii) a mass storage for receiving data from said dual port shared memory and storing said data when a user causes a first predetermined command to be generated by said user interface mechanism; and (iii) a monitor for displaying data received from said dual port shared memory.

2. A general purpose avionics display monitor as claimed in claim 1, wherein said data processing system includes a work buffer for temporarily storing data received from said dual port shared memory prior to said data being received and stored in said mass storage when a user causes a predetermined command to be generated by said user interface mechanism.

3. A general purpose avionics display monitor as claimed in claim 1, wherein said data processing system also inlcudes a printer for printing data temporarily stored in a work buffer when a user causes a second predetermined command to be generated by said user interface mechanism.

4. A general purpose avionics display monitor as claimed in claim 3, wherein said data processing system includes a work buffer for temporarily storing data received from said dual port shared memory prior to said data being received and stored in said mass storage when a user causes a predetermined command to be generated by said user interface mechanism.

5. A general purpose avionics display monitor as claimed in claim 3, wherein said first and second predetermined commands are the same command.

6. A general purpose avionics display monitor as claimed in claim 5, wherein said data processing system includes a work buffer for temporarily storing data received from said dual port shared memory prior to said data being received and stored in said mass storage when a user causes a predetermined command to be generated by said user interface mechanism.

7. A general purpose avionics display monitor as claimed in claim 1, wherein:

(a) said general purpose avionics display monitor includes a source of discrete inputs;

(b) said transfer data bus of said interface means is coupled to said source of discrete inputs; and (c) said dual port shared memory includes a data flag section and wherein said programmed CPU controls the state of said data flags of said dual port shared memory based on the high/low state of said discrete inputs.

8. A general purpose avionics display monitor as claimed in claim 7, wherein said data processing system includes a work buffer for temporarily storing data received from said dual port shared memory prior to said data being received and stored in said mass storage when a user causes a predetermined command to be generated by said user interface mechanism.

9. A general purpose avionics display monitor as claimed in claim 7, wherein said data processing system also includes a printer for printing data temporarily stored in said work buffer when a user causes a second predetermined command to be generated by said user interface mechanism.

10. A general purpose avionics display monitor as claimed in claim 9, wherein said data processing system includes a work buffer for temporarily storing data received from said dual port shared memory prior to said data being received and stored in said mass storage when a user causes a predetermined command to be generated by said user interface mechanism.

11. A general purpose avionics display monitor as claimed in claim 9, wherein said first and second predetermined commands are the same command.

12. A general purpose avionics display monitor as claimed in claim 11, wherein said data processing system includes a work buffer for temporarily storing data received from said dual port shared memory prior to said data being received and stored in said mass storage when a user causes a predetermined command to be generated by said user interface mechanism.

13. A general purpose avionics display monitor as claimed in claim 7, wherein said aircraft data buses connect at least one MCDU to an FMC for transmitting page display data to said MCDU from said FMC and key push data to said FMC from said MCDU.

14. A general purpose avionics display monitor as claimed in claim 13, wherein said data processing system includes a work buffer for temporarily storing data received from said dual port shared memory prior to said data being received and stored in said mass storage when a user causes a predetermined command to be generated by said user interface mechanism.

15. A general purpose avionics display monitor as claimed in claim 13, wherein said data processing system also includes a printer for printing data temporarily stored in a work buffer when a user causes a second predetermined command to be generated by said user interface mechanism.

16. A general purpose avionics display monitor as claimed in claim 15, wherein said data processing system includes a work buffer for temporarily storing data received from said dual port shared memory prior to said data being received and stored in said mass storage when a user causes a predetermined command to be generated by said user interface mechanism.

17. A general purpose avionics display monitor as claimed in claim 15, wherein said first and second predetermined commands are the same command.

18. A general purpose avionics display monitor as claimed in claim 17, wherein said data processing system includes a work buffer for temporarily storing data received from said dual port shared memory prior to said data being received and stored in said mass storage when a user causes a predetermined command to be generated by said user interface mechanism.

19. A general purpose avionics display monitor as claimed in claim 13, wherein:

(a) said general purpose avionics display monitor includes at least one ARINC transmitter coupled to the transfer data bus that transmits key push data from said MCDU to said FMC;

(b) said general purpose avionics display monitor includes at means for decoupling said MCDU from said transfer data bus that transmits key push data from said MCDU to said FMC;

(c) said data processing system produces key push data similar to that produced by said MCDU when a user causes predetermined autotest commands to be generated by said user interface mechanism;

(d) said user key push data produced by said data processing system are transferred to said dual port shared memory; and (e) said CPU program transfers said key push data from said dual port shared memory to said at least one ARINC transmitter.

* * * * *

UNITED STATES PATENT AND TRADEMARK OFFICE
CERTIFICATE OF CORRECTION

PATENT NO. : 5,019,980
DATED : May 28, 1991
INVENTOR(S) : Benjamin F. Starr et al.

It is certified that error appears in the above-identified patent and that said Letters Patent is hereby corrected as shown below:

| COLUMN | LINE | |
|--------|------|---|
| 5 | 5 | "interfare" should read --interfere--. |

Signed and Sealed this

Thirtieth Day of March, 1993

Attest:

STEPHEN G. KUNIN

*Attesting Officer*    Acting Commissioner of Patents and Trademarks